(12) United States Patent
Makiyama et al.

(10) Patent No.: US 6,998,695 B2
(45) Date of Patent: Feb. 14, 2006

(54) SEMICONDUCTOR DEVICE HAVING A MUSHROOM GATE WITH HOLLOW SPACE

(75) Inventors: Kozo Makiyama, Kawasaki (JP); Tsuyoshi Takahashi, Kawasaki (JP); Masahiro Nishi, Yamanashi (JP)

(73) Assignees: Fujitsu Limited, Kawasaki (JP); Eudyna Devices Inc., Yamanashi (JP)

( * ) Notice: Subject to any disclaimer, the term of this patent is extended or adjusted under 35 U.S.C. 154(b) by 146 days.

(21) Appl. No.: 10/649,643

(22) Filed: Aug. 28, 2003

(65) Prior Publication Data

US 2004/0058485 A1    Mar. 25, 2004

(30) Foreign Application Priority Data

Aug. 29, 2002    (JP)    ............................... 2002-251266

(51) Int. Cl.
*H01L 29/00*    (2006.01)

(52) U.S. Cl. ...................... 257/522; 257/499; 257/506; 438/309; 438/319; 438/400; 438/411

(58) Field of Classification Search ................ 257/522; 438/319, 411
See application file for complete search history.

(56) References Cited

U.S. PATENT DOCUMENTS 6,040,248 A  *  3/2000  Chen et al.

FOREIGN PATENT DOCUMENTS

| JP | 6-120253 | 4/1994 |
|----|----------|--------|
| JP | 8-107119 | 4/1996 |
| JP | 9-27505 | 1/1997 |
| JP | 9-330937 | 12/1997 |
| JP | 10-150054 | * 6/1998 |

* cited by examiner

*Primary Examiner*—Nathan J. Flynn
*Assistant Examiner*—Kevin Quinto
(74) *Attorney, Agent, or Firm*—Armstrong, Kratz, Quintos, Hanson & Brooks, LLP

(57) ABSTRACT

A method of manufacturing a semiconductor device has the steps of: forming a mushroom gate traversing an active region of a semiconductor substrate and having a fine gate and an expanded over gate formed thereon; coating a first organic material film on the semiconductor substrate; patterning the first organic material film and leaving the first organic material film only near the mushroom gate; coating a second organic (insulating) material film covering the left first organic material film; forming an opening through the second organic material film to expose the first organic material film; and dissolving and removing the first organic material film via the opening to form a hollow space in the second organic material film.

32 Claims, 12 Drawing Sheets

SEMICONDUCTOR DEVICE HAVING A MUSHROOM GATE WITH HOLLOW SPACE

CROSS REFERENCE TO RELATED APPLICATION

This application is based on and claims priority of Japanese Patent Application No. 2002-251266 filed on Aug. 29, 2002, the entire contents of which are incorporated herein by reference.

BACKGROUND OF THE INVENTION

A) Field of the Invention

The present invention relates to a high speed semiconductor device and its manufacture, and more particularly to a semiconductor device having a mushroom gate and its manufacture.

In this specification, "exposure" is intended to mean the concept including not only irradiation of light but also irradiation of other energy beams such as an electron beam and an X-ray beam.

B) Description of the Related Art

A mushroom gate is used as the gate of a high speed compound semiconductor transistor such as a high electron mobility transistor (HEMT) in order to reduce the resistance of the gate electrode while the gate length is made short. The mushroom gate is narrow along the current direction at the stem in contact with a semiconductor substrate and broad along the current direction at the upper head. Source and drain electrodes are formed on both sides of the mushroom gate to constitute a transistor structure.

In order to form multi-level wiring layers over a semiconductor substrate, it is necessary to form an insulating film burying the gate electrode. The material of the insulating film is inorganic insulating material such as silicon oxide and silicon nitride or organic (insulating) material. As the surface of a gate electrode is covered with the insulating film, parasitic capacitance of the gate electrode increases because a dielectric constant of the insulating film is larger than 1 which is the dielectric constant of air.

FIG. 8 is a cross sectional view showing an example of the structure of a compound semiconductor device having multi-level wiring layers. A semiconductor substrate 100 has a structure in which a functional semiconductor region is formed on an underlying substrate of GaAs or InP. A low resistance layer is formed in the upper surface layer of the semiconductor substrate 100, and a source electrode 101 and a drain electrode 102 are formed on the low resistance layer in ohmic contact therewith. The surface low resistance layer is removed in the intermediate area between the source electrode 101 and drain electrode 102 to form a recess area. On this recess area, a mushroom gate 105 is formed.

The mushroom gate 105 has a stem (hereinafter called a fine gate) which contacts the semiconductor substrate 100 and is narrow along the current direction and a head (hereinafter called an over gate) which is broad along the current direction. In order to enhance high speed operation the size of the fine gate along the current direction is made narrow, and in order to reduce the gate resistance the size of the over gate along the current direction is made broad.

If multi-level wiring layers are to be formed, a first interlayer insulating film 110 is formed burying the gate electrode 105. The first interlayer insulating film 110 covers the side walls of the fine gate of the gate electrode 105 and extends covering the upper surface of the over gate. Contact holes are formed in the first interlayer insulating film 110 and first-layer wiring patterns 112 and 113 are formed being connected to the source electrode 101 and drain electrode 102. Similarly, the gate electrode is also connected to a wiring pattern. A second interlayer insulating film 115 is formed burying the first layer wiring patterns 112 and 113. A via hole is formed in the second interlayer insulating film 115 and a second layer wiring pattern 117 is formed being electrically connected to the first layer wiring pattern.

With this gate electrode structure, the upper, lower and side surfaces of the over gate and the side surfaces of the fine gate are in contact with the interlayer insulating film 110. The parasitic capacitance of the gate electrode 105 therefore increases which is determined by the dielectric constant and the like of the interlayer insulating film. In order to reduce the parasitic capacitance of the over gate, it is desired to remove the interlayer insulating film at least under the over gate.

A lamination structure has been formed conventionally in a space surrounding the fine gate, and a partial region of the lamination structure is made hollow to reduce the parasitic capacitance of the gate electrode. Another proposal has been made in which a polyimide layer is formed burying a gate electrode, the polyimide film is removed by anisotropic etching with oxygen plasma by using the gate electrode as a mask to leave polyimide only under the over gate, thereafter an insulating film of silicon oxide, silicon nitride or the like is formed covering the gate electrode, and then the polyimide region under the over gate is removed by ashing with oxygen plasma.

It is not easy to manufacture a semiconductor device which has a high yield, a high reliability and a reduced parasitic capacitance of a mushroom gate covered with an interlayer insulating film.

SUMMARY OF THE INVENTION

An object of this invention is to provide a semiconductor device having a mushroom gate covered with an interlayer insulating film capable of suppressing an increase in parasitic capacitance of the mushroom gate, and to provide its manufacture method.

Another object of the invention is to provide a semiconductor device having a mushroom gate covered with an interlayer insulating film, which device is easy to operate at high speed and has a high reliability, and to provide its manufacture method.

According to one aspect of the present invention, there is provided a method of manufacturing a semiconductor device comprising the steps of: (a) forming a mushroom gate on a semiconductor substrate, the mushroom gate traversing an active region of the semiconductor substrate and having a fine gate and an over gate formed on the fine gate and constituting an electrode portion having a broadened size along a current direction; (b) coating a first organic material film on the semiconductor substrate, the first organic material film covering at least the fine gate and a lower surface of the over gate of the mushroom gate; (c) patterning the first organic material film and leaving the first organic material film only near at the mushroom gate; (d) coating a second organic material film having chemical characteristics different from chemical characteristics of the first organic material film, the second organic material film covering the left first organic material film; (e) forming an opening through the second organic material film to expose the first organic material film; and (f) dissolving and removing the first organic material film via the opening to form a hollow space in the second organic material film.

According to another aspect of the present invention, there is provided a semiconductor device comprising: a semiconductor substrate having an active region; a mushroom gate formed on the semiconductor substrate and traversing the active region, the mushroom gate having a fine gate and an over gate formed on the fine gate and having a broadened size along a current direction; an organic material film defining a hollow space, the hollow space surrounding at least a side surface of the fine gate and a lower surface of the over gate respectively of the mushroom gate, and the hollow space having a curved surface at an interface with the organic material film; and openings reaching the hollow space from an upper surface of the organic material film in an area outside of the active region.

As above, there are provided a semiconductor device capable of suppressing an increase in parasitic capacitance of a gate electrode covered with an interlayer insulating film and its manufacture method.

DESCRIPTION OF THE PREFERRED EMBODIMENTS

Embodiments of the invention will be described with reference to the accompanying drawings.

FIGS. 1A to 1H are cross sectional views and plan views illustrating the main processes of a method of manufacturing a semiconductor device according to a first embodiment of the invention.

Figure 1A:
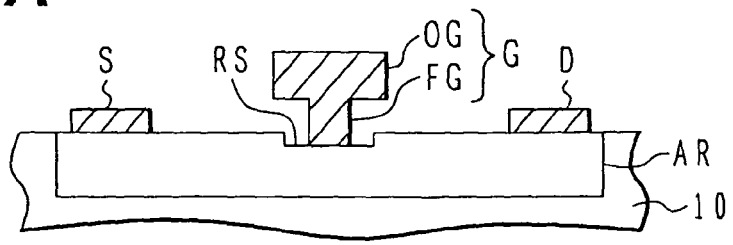
FIGS. 1A to 1H are cross sectional views and plan views illustrating the main processes of a method of manufacturing a semiconductor device according to an embodiment of the invention.
Figure 1A:
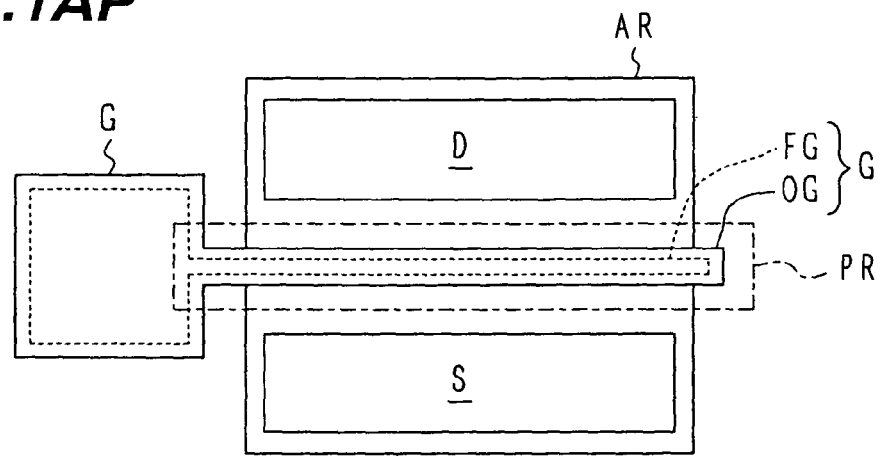

As shown in FIG. 1A, an active region AR is defined in the surface layer of a semiconductor substrate 10 having a functional semiconductor layer. The region other than the active region AR is a semi-insulating region doped with oxygen or the like. The semiconductor substrate 10 has a low resistance layer in the uppermost surface layer. A portion of the low resistance layer is removed to form a recess RS. On the surface of the recess, a gate electrode G is formed which has a fine gate FG as a mushroom stem whose size (gate length) along the current direction is confined small and an over gate OG which is formed on the fine gate and whose size along the current direction is made large to reduce the total resistance of the gate electrode. A source electrode S and a drain electrode D are formed on the low resistance layer on both sides of the gate electrode G.

FIG. 1AP is a schematic plan view showing the layout of the active region AR, source electrode S, drain electrode D and gate electrode G. The active region AR is a rectangular region surrounding the source electrode S and drain electrode D. The gate electrode G is elongated along the gate width direction. The left end of the gate electrode G is enlarged to form a pad. The drain electrode D and source electrode S are formed above and below the gate electrode G as viewed in FIG. 1AP.

The gate electrode G has the lower fine gate FG and the upper over gate OG. The fine gate FG traverses the active region AR between the source electrode S and drain electrode D and has the pad having an enlarged area in the semi-insulating peripheral area. The over gate OG covers the fine gate FG traversing the active region and has an enlarged (broad) size along the current direction and also an enlarged size along the gate width direction. The over gate OG has therefore a shape protruding from the edge of the fine gate FG as viewed in plan both in the current (gate length) direction and a crossing (gate width) direction.

Figure 1B:
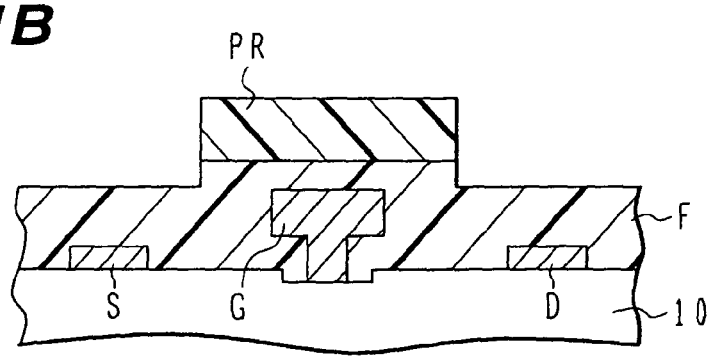

As shown in FIG. 1B, a filler layer F of organic (insulating) material is formed burying the gate electrode G, source electrode S and drain electrode D. The filler layer F fills beforehand a region where a hollow space is to be formed, and is made of, for example, polymethylglutarimide (PMGI). Although this filler material illustratively presented is insulating, non-insulating material may also be used because the filler layer will be removed later. Photoresist is formed on the filler layer F, exposed and developed to form a resist pattern PR. With the structure shown in FIG. 1B, the resist pattern PR covers at least the whole area of the gate electrode G in the active region.

The shape of the resist pattern PR is shown by one-dot chain line in FIG. 1AP. The resist pattern PR has a plan shape inclusive of the over gate excepting the pad.

By using the resist pattern PR as a mask, the filler layer F is wet etched. For example, the filler layer F of polymethylglutarimide is etched with tetramethylammonium hydroxide (TMAH). Instead of wet etching, dry etching with oxygen gas may be used. The remaining resist mask PR is thereafter removed by solvent which does not dissolve the filler layer F. For example, the resist pattern PR is removed by using isopropyl alcohol.

Figure 1C:
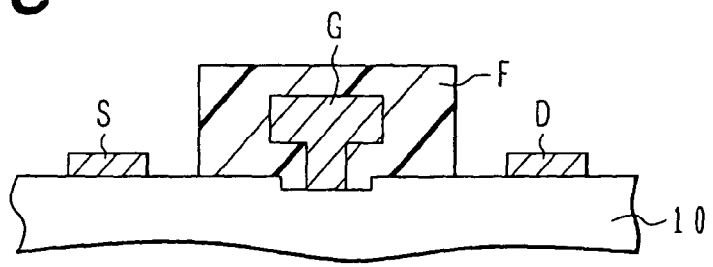

FIG. 1C is a cross sectional view showing the structure of the patterned semiconductor device with the resist mask being removed. The gate electrode G is surrounded by the filler layer F. As shown in FIG. 1AP, the pad of the gate electrode G formed in the area outside of the active region AR is exposed outside of the filler layer F.

Figure 1D:
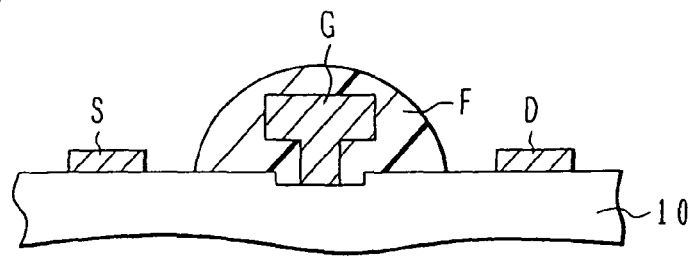
Figure 1D:
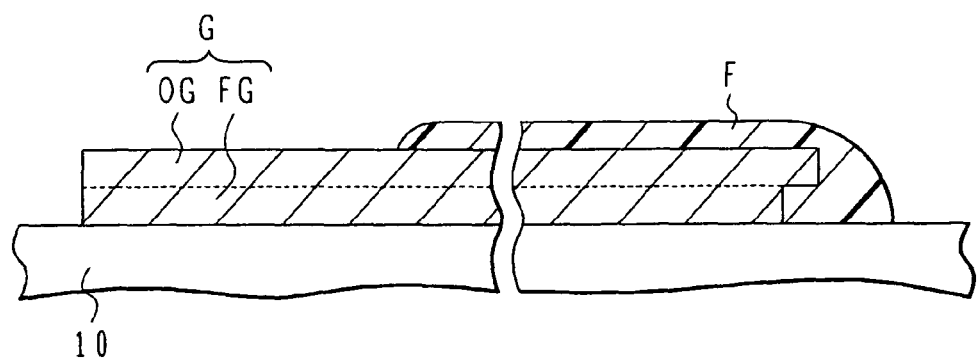

As shown in FIG. 1D, the semiconductor substrate is heated to soften or fluidize the filler layer F. After the filler layer F is fluidized, the surface shape of the filler layer is stabilized at a shape determined by the surface tension. The filler layer F after fluidization has therefore the shape having a relatively broad width on the surface of the semiconductor substrate and reducing the width toward the upper area.

FIG. 1DX shows the shape of the gate electrode G and filler layer F as viewed along the gate width direction of the gate electrode G. As seen from FIG. 1DX, the end of the filler layer F is tapered and the size (thickness) is gradually reduced.

Figure 1E:
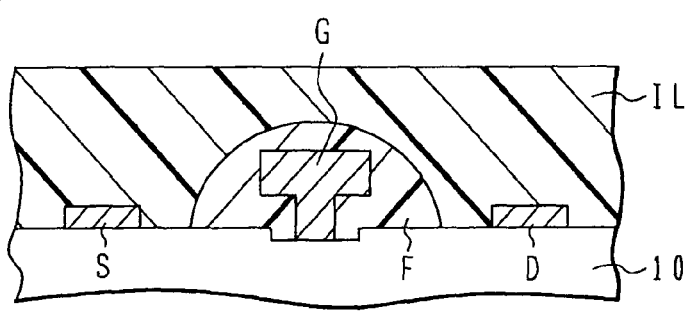
Figure 1E:
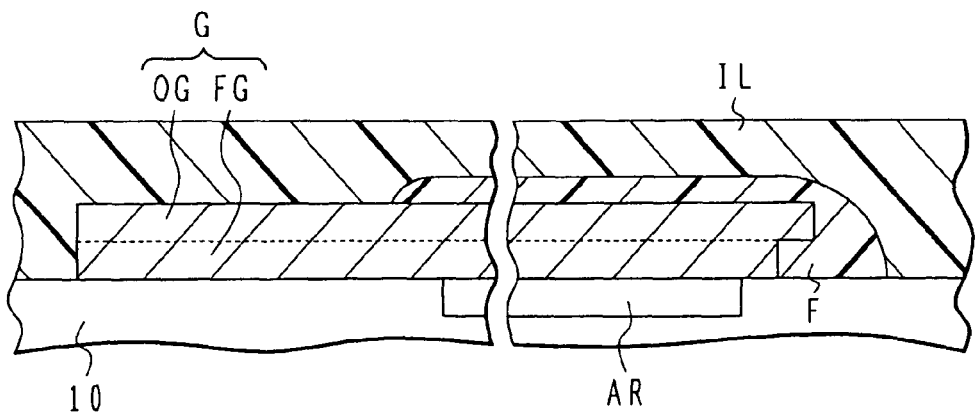

As shown in FIG. 1E, an interlayer insulating film IL of organic material having good insulating characteristics is formed burying the filler layer F. For example, the interlayer insulating film IL is made of benzocyclobutene (BCB). It is preferable that after the interlayer insulating film IL is formed, it is fluidized once to release stress generated when the layer IL was formed. The interface between the filler layer F and organic insulating material layer IL forms a curved surface.

FIG. 1EX shows the cross sectional structure viewed along the gate width direction. The filler layer F surrounds the effective region of the gate electrode G on the active region AR, and the interlayer insulating film IL covers the whole area of the gate electrode.

Figure 1F:
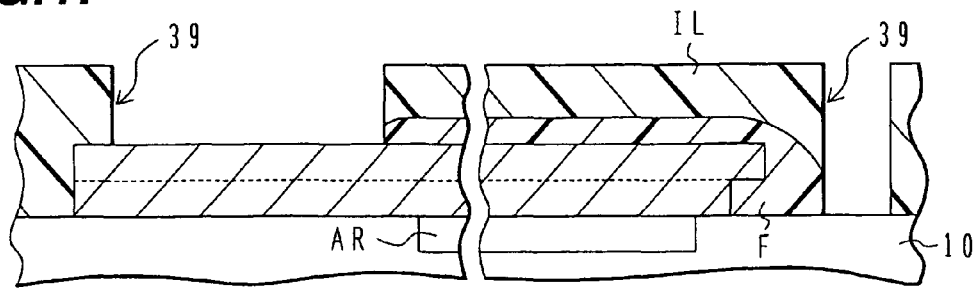
Figure 1F:
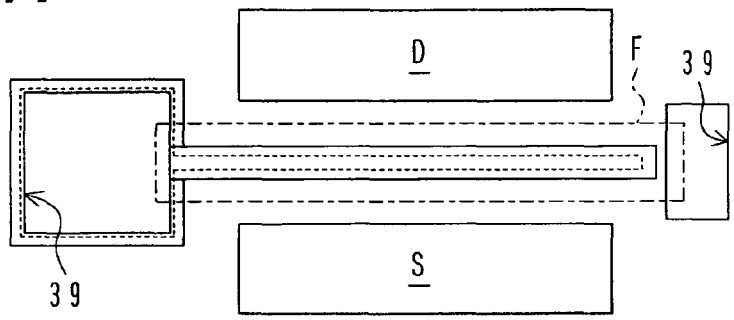

As shown in FIG. 1F, openings 39 are formed through the interlayer insulating layer IL through etching using a resist mask or the like. The openings 39 expose both ends of the filler layer F in the area outside of the active region AR.

FIG. 1FP is a plan view showing the relation between the filler layer F and openings 39. During the etching of the openings 39, both ends of the filler layer F are also etched. Partial areas of the filler layer F are therefore exposed to the side walls of the openings 39. Etchant for dissolving the filler layer F is flowed in the openings 39 to remove the filler layer F.

As the etchant, N-methyl-2-pyrrolidinone (NMP) may be used if the filler layer F is made of polymethylglutarimide and the interlayer insulating film IL is made of benzocyclobutene. If the etchant is heated, the etch rate can be speeded up. By using N-methyl-2-pyrrolidinone heated to 75° C., a hollow space was able to be formed in about 10 minutes, the hollow space having a length of 50 $\mu$m in the gate width direction and a cross sectional area of 0.5 $\mu$m$^2$ in the crossing direction.

Figure 1G:
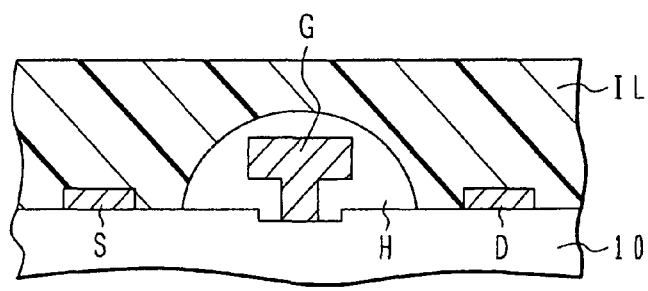

FIG. 1G shows the cross sectional structure near the gate electrode G with the filler layer being removed at least from the active region. The gate electrode G is surrounded with the hollow space H. The interface between the hollow space H and interlayer insulating film IL is a curved surface. The interlayer insulating film IL does not contact the main portion of the gate electrode G. Since the dielectric constant of the hollow space H is 1, an increase in the parasitic capacitance of the gate electrode G can be greatly suppressed.

Figure 1H:
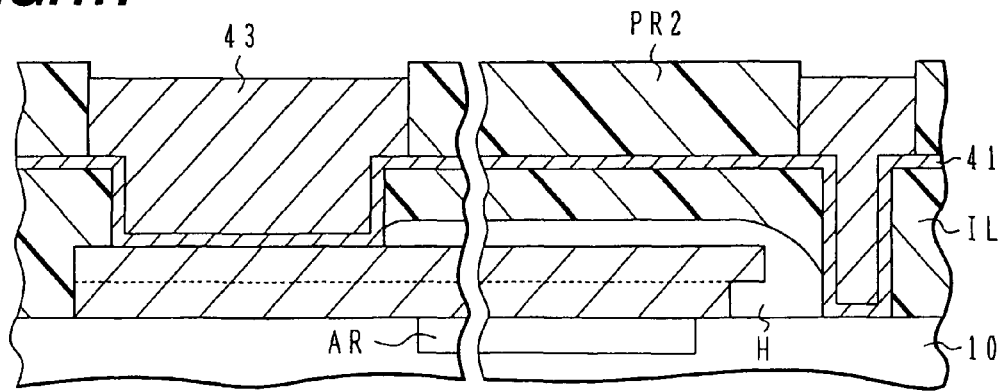

As shown in FIG. 1H, after the filler layer F is removed, a seed metal layer 41 is deposited on the upper surface of the substrate, for example, by sputtering. The seed metal layer 41 deposits also at the borders between the filler layer F and openings 39 so that the openings at the borders can be sealed. Since the filler layer F was fluidized to form the tapered ends, the height of the hollow space H at the position in contact with the openings 39 can be set low by selecting the positions where the openings 39 are formed. By properly setting the heights of the hollow space H at the borders, the deposited seed metal layer can seal the openings at the borders.

After the seed metal layer 41 is formed, a resist pattern PR2 is formed on the interlayer insulating film IL with the seed metal layer 41, and plated layers 43 are formed in the openings. After the plated layers 43 are formed, the resist pattern PR2 is removed and the seed metal layer 41 externally exposed is also removed.

Figure 2A:
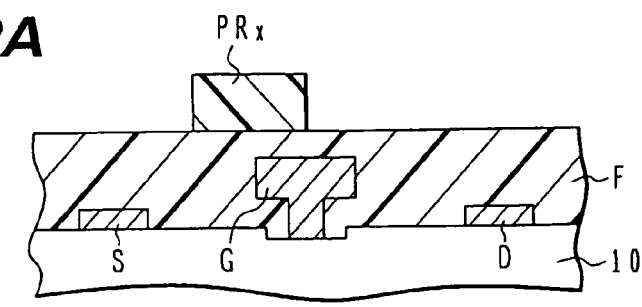
FIGS. 2A to 2E are cross sectional views illustrating a method of manufacturing a semiconductor device according to another embodiment of the invention.

FIGS. 2A to 2E are cross sectional views illustrating a method of manufacturing a semiconductor device according to another embodiment of the invention. As shown in FIG. 2A, similar to the above-described embodiment, on a semiconductor substrate 10, a source electrode S, a drain electrode D and a gate electrode G are formed and a filler layer F is formed through coating, the filler layer F burying the electrodes.

A resist pattern PRx is formed on the filler layer F. The resist pattern PRx covers the gate electrode G on the source side and exposes the drain side. By using the resist pattern PRx as a mask, the filler layer F is anisotropically etched to selectively remove it. The resist pattern PRx is thereafter removed.

Figure 2B:
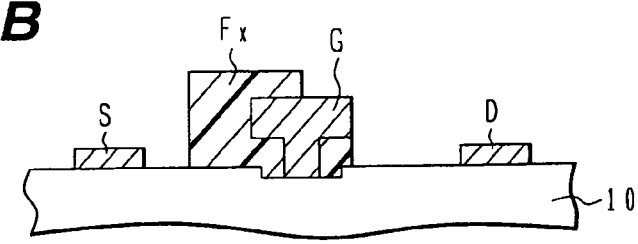

As shown in FIG. 2B, the filler layer F is left under the resist pattern PRx, and in the region not covered with the resist pattern PRx, the filler layer F is left in the region covered with the gate electrode G. A filler layer pattern Fx is thus formed. The filler layer pattern Fx is left on the gate electrode G near the source side and under the gate electrode G.

Figure 2C:
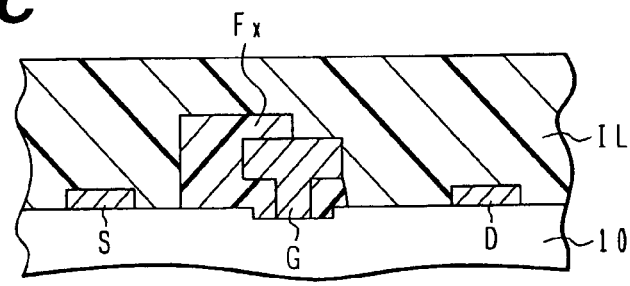

As shown in FIG. 2C, an organic (insulating) material film IL is coated covering the gate electrode G, source electrode S, drain electrode D and the filler layer pattern Fx to form an interlayer insulating film.

Figure 2D:
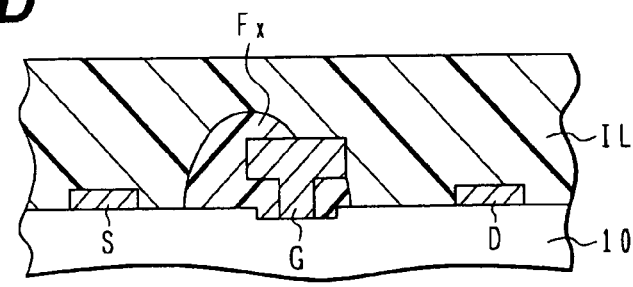

As sown in FIG. 2D, the filler layer pattern and interlayer insulating film are heated and fluidized. For example, they are heated up to a temperature equal to or higher than the higher softening point of the two materials of the filler layer pattern and interlayer insulating film. As the filler layer pattern Fx and organic insulating film IL are fluidized (softened or molten), the interface therebetween becomes a curved surface because of the surface tension. As the organic material is fluidized, stress is released, which was generated when the organic insulating film was formed.

Thereafter, processes similar to the processes shown in FIGS. 1F to 1H are performed to expose the filler layer pattern in openings. The filler layer pattern is removed by wet etching.

Figure 2E:
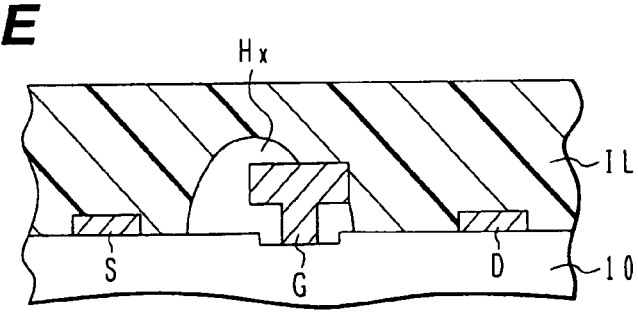

As shown in FIG. 2E, the filler layer pattern Fx is therefore removed and a hollow space Hx is formed.

Of the parasitic capacitance of the gate electrode, gate-drain capacitance (Cgd) depends largely upon the capacitance of the dielectric member under the over gate. By making the area under the over gate hollow, the gate-drain capacitance (Cgd) of the gate electrode is lowered greatly.

Gate-source capacitance (Cgs) of the gate electrode depends largely upon the capacitance of the dielectric member widely existing between the gate and source electrodes. The gate-source capacitance depends also upon the dielectric member existing on the side and upper surfaces of the gate electrode G. By making the hollow space covering or encapsulating the source side of the gate electrode G, the gate-source capacitance (Cgs) can be reduced greatly.

With this structure, the drain side of the gate electrode G is in contact with the interlayer insulating film IL. A physical support force is therefore imparted to the gate electrode and the mechanical strength of the gate electrode increases.

FIGS. 3A to 3D are cross sectional views illustrating a method of manufacturing a semiconductor device according to still another embodiment of the invention.

Figure 3A:
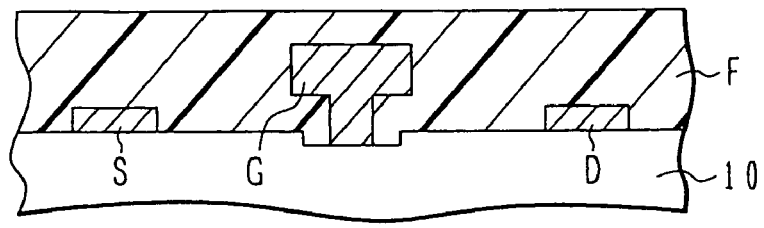
FIGS. 3A to 3D are cross sectional views illustrating a method of manufacturing a semiconductor device according to still another embodiment of the invention.

As shown in FIG. 3A, on the surface of a semiconductor substrate 10, a source electrode S, a drain electrode D and a gate electrode G are formed and a filler layer F is formed through coating, the filler layer F burying the electrodes.

Figure 3B:
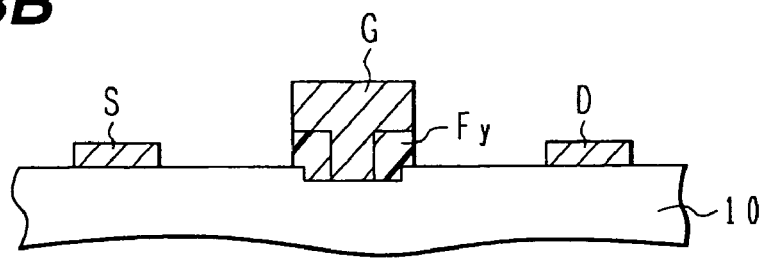

As shown in FIG. 3B, the filler layer F is anisotropically etched downward. The regions under the over gate of the gate electrode G is masked with the gate electrode so that they are left unetched. A filler layer pattern Fy is therefore left under the over gate of the gate electrode G.

Figure 3C:
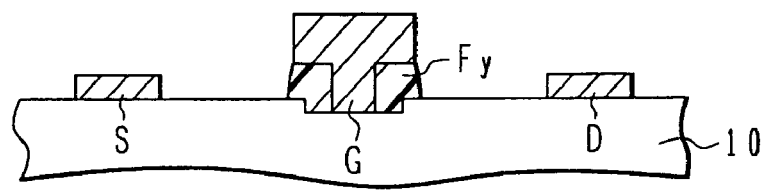

As shown in FIG. 3C, the substrate 10 is heated to fluidize the filler layer pattern Fy. The surface of the fluidized filler layer pattern Fy is curved because of the surface tension.

Thereafter, a process similar to the process shown in FIG. 1E is performed to form an interlayer insulating film covering the filler layer pattern and gate electrode. Openings are formed through the interlayer insulating film to wet etch and remove the filler layer pattern.

Figure 3D:
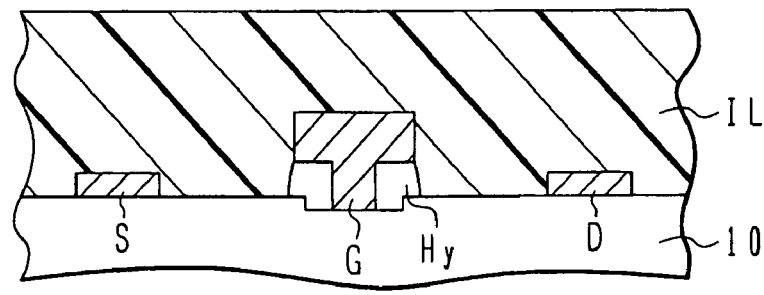

As shown in FIG. 3D, a hollow space Hy is therefore formed in the region where the filler layer pattern Fy was removed.

This method does not require to form a resist pattern over the gate electrode, and is possible to pattern the filler layer by using only the gate electrode as a mask. The manufacture processes can therefore be simplified.

In the above embodiments, openings are formed through the interlayer insulating film to form the hollow space. It is often desired to seal the hollow space communicating with the openings, in order to reliably perform later processes.

FIGS. 4A to 4K illustrate a method of modifying the shape of an over gate.

Figure 4A:
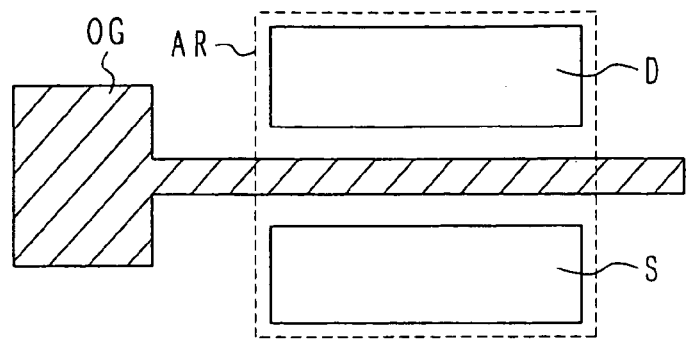
FIGS. 4A to 4K are plan views and cross sectional views illustrating a modification of the embodiment according to the invention.

FIG. 4A is a plan view showing the layout of a semiconductor device. A drain region D and a source region S are formed on the active region AR of a semiconductor substrate. Thereafter, a resist lamination structure is formed which is used for forming a mushroom gate by lift-off. Exposure for the over gate is thereafter performed. The exposure region for the over gate is shown by a hatched region OG.

Figure 4B:
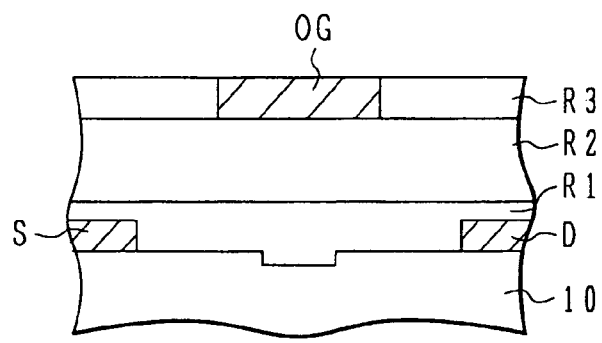

FIG. 4B shows the cross sectional structure of the semiconductor device in the state shown in FIG. 4A. The source electrode S and drain electrode D are formed on the semiconductor substrate 10. On this semiconductor substrate, the resist lamination structure is formed including a lower layer R1, a middle layer R2 and an upper layer R3. The middle resist layer R2 is not patterned by exposure, but it is isotropically etched via the opening in the upper layer R3 to form a laterally broadened opening. The lower layer R1 and upper layer R3 are made of electron beam radiation resist. The exposure region OG for the over gate is formed in the upper layer R3.

Figure 4C:
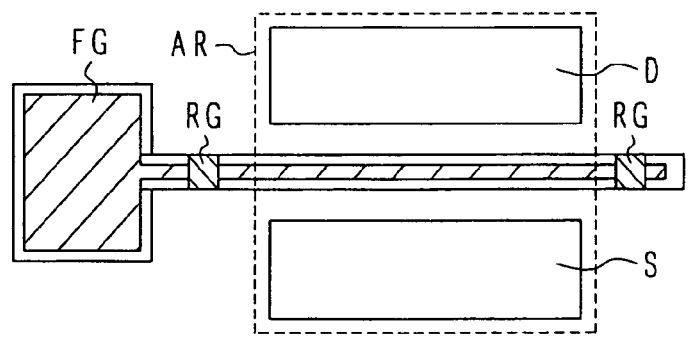

As shown in FIG. 4C, exposure for a fine gate is performed in the region FG shown by leftwardly lowering hatched lines. Exposure with a lower intensity is performed in the regions RG shown by rightwardly lowering hatched lines. With this lower intensity exposure, although the whole thickness of the lower layer R1 is not exposed, a partial thickness is exposed.

Figure 4D:
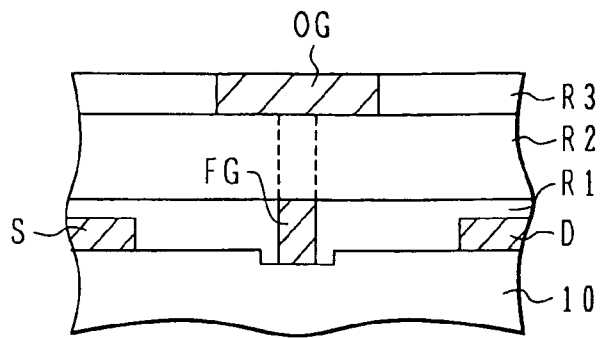

FIG. 4D is a cross sectional view of the semiconductor device after the fine gate exposure.

Figure 4E:
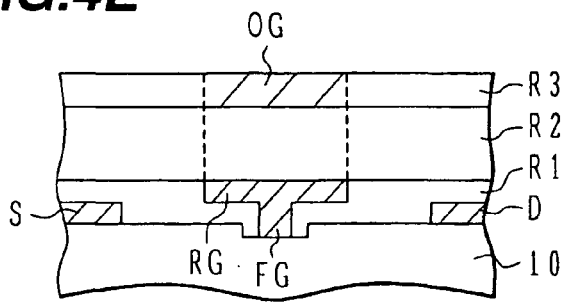

FIG. 4E is a schematic cross sectional view showing the structure of the fine gate exposure region FG and the exposure regions RG for lowering the over gate. In this state, development is performed. The exposure region OG in the upper layer R3 is therefore removed, the laterally broadening region is formed in the middle layer R2 and the exposure region in the lower layer R1 is removed. The surface of the over gate in the lower layer R1 has the shape lowered in the over gate lowering regions RG. A distance between the substrate and over gate is therefore shortened.

Figure 4F:
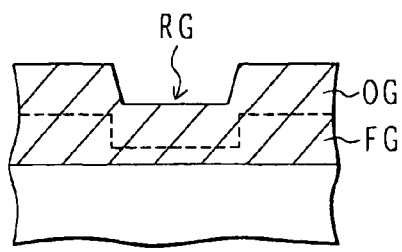

FIG. 4F is a schematic cross sectional view showing the structure of a mushroom gate along the longitudinal (gate width) direction formed by developing the resist patterns shown in FIG. 4E, depositing a gate electrode layer, and performing lift-off. In the over gate lowering regions RG, the height of the fine gate FG is lowered so that the over gate OG extends downward correspondingly and the lower surface of the over gate OG is lowered correspondingly. The cross section shown in FIG. 4F is at the position near the end of the gate electrode along the gate width direction, and not in the gate central area.

In the over gate lowering regions, the fine gate FG may not be formed. To this end, the fine gate exposure FG is not performed. If the fine gate is not formed in the over gate lowering regions, openings are formed so that a flow of filler layer dissolution liquid can be enhanced.

Figure 4G:
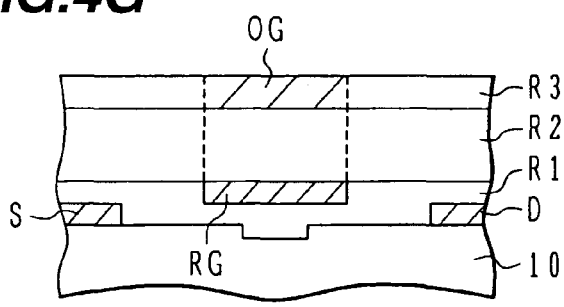

FIG. 4G is a schematic cross sectional view of the semiconductor device without the fine gate exposure in the over gate lowering regions RG. Development removes the over gate region OG, underlying laterally broadening region and over gate lowering regions RG.

Figure 4H:
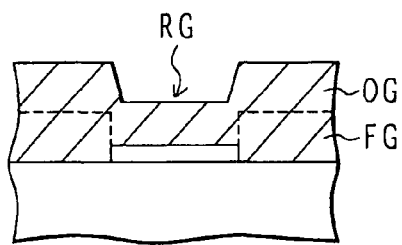

FIG. 4H is a schematic cross sectional view showing the structure of a mushroom gate along the longitudinal (gate width) direction formed by using the developed resist pattern. The fine gate FG is omitted in the over gate lowering regions RG. Since opening is formed through the fine gate FG, a flow of etchant for wet etching the filler layer can be enhanced.

After the gate electrode is formed, similar to the embodiments described earlier, a filler layer and an organic insulating layer are formed. Openings are formed to dissolve and remove the filler layer and form an interlayer insulating structure having a hollow space near the gate electrode.

Figure 4I:
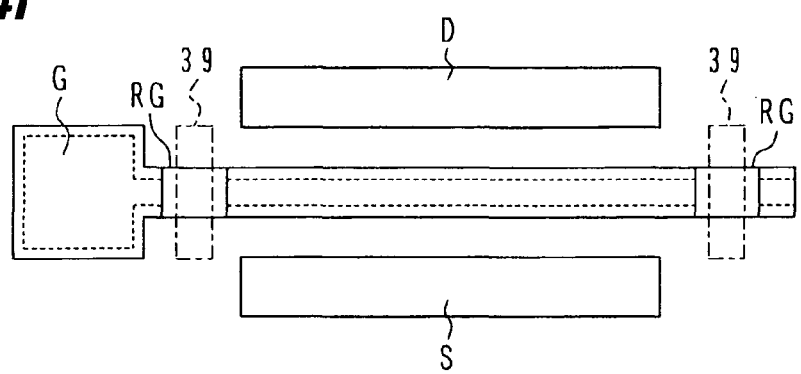

As shown in FIG. 4I, a resist layer is formed on the organic insulating layer and openings 39 traversing the over gate lowering regions RG are formed by etching. Since the lower surface of the over gate is at the position nearer to the substrate in the regions of the openings 39, the later sealing process can be made easily.

Figure 4J:
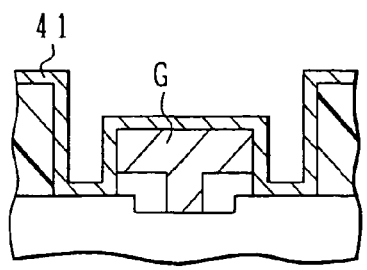

FIG. 4J shows a seed metal layer 41 deposited in the openings. Since the lower surface of the over gate of the gate electrode G is at the position nearer to the substrate, it is easy for the seed metal layer 41 to seal the gap between the substrate 10 and gate electrode G.

Figure 4K:
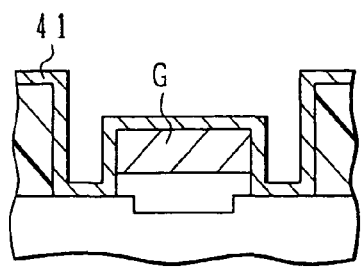

FIG. 4K shows the structure in a case where the fine gate is not formed in the over gate lowering regions. Only the over gate of the gate electrode G exists in the over gate lowering regions, and an opening or communication path is formed under the over gate. The seed metal layer 41 seals the gap between the gate electrode G and substrate 10, similar to that shown in FIG. 4J.

It is preferable that conductive foreign matters are suppressed from entering the hollow space as much as possible when for example a lead electrode, etc. is formed in the opening.

Figure 5A:
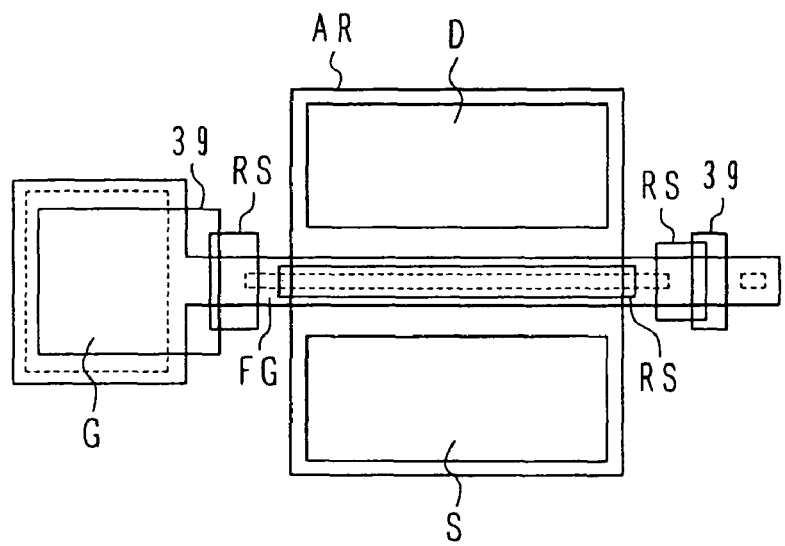
FIGS. 5A and 5B are a plan view and a cross sectional view illustrating a modification of the embodiment according to the invention.
Figure 5B:
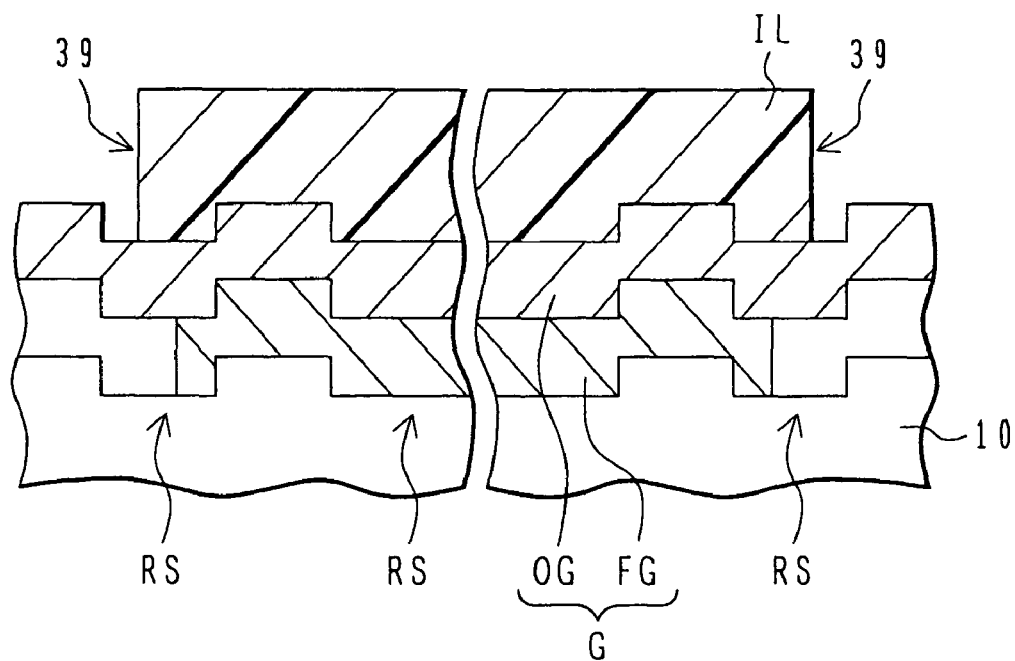

FIGS. 5A and 5B illustrate a method of realizing the structure of a hollow space having an intermediately upward bent portion as viewed from the opening.

As shown in FIG. 5A, a recess RS is formed by removing the low resistance layer on the substrate surface in an area of the active region AR where the gate electrode contacts, and other recesses RS are formed by removing the low resistance layer on the substrate surface in areas spaced apart from and on both sides of the active region. Similar to the embodiments described earlier, a drain electrode D and a source electrode S are formed and a gate electrode G is formed by using a resist lamination structure. The gate electrode G is constituted of a fine gate FG traversing the active region AR, a portion having the same height as that of the fine gate and supporting the pad, and an over gate OG.

Similar to the embodiments described earlier, a filler layer and an interlayer insulating film are formed, and openings are formed through the interlayer insulating film to remove the filler layer.

FIG. 5B is a schematic cross sectional view showing the gate along the gate width direction. The low resistance layer on the substrate surface in the active region is removed to form the recess RS. The substrate surface once rises near at opposite ends of the gate electrode, and the recesses RS are formed in the outer areas by removing the low resistance layer. On such an irregular substrate surface, the gate electrode G having the fine gate FG and over gate OG is formed.

The cross sectional structure of the gate electrode G is conformal to the irregular surface of the substrate 10. When the hollow space is formed under the over gate OG, the hollow space between the over gate and substrate surface has a portion rising upward in the area from the outer recess RS to the active region. This portion lowers the possibility that flown and scattered deposits enter the active region when the conductive layer is formed in the openings 39.

A combination of the irregular substrate surface and downward projections of the over gate may be used. If the lower surface of the over gate OG is lowered in the recesses RS, it becomes more difficult for foreign matters to enter the active region and it becomes easy to seal the hollow space.

The fundamental embodiments of the invention have been described above. A specific embodiment will be described.

Figure 6A:
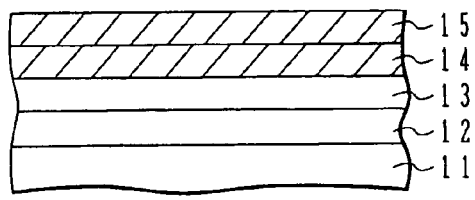
FIGS. 6A to 6O are cross sectional views and a plan view illustrating a more specific embodiment of the invention.
Figure 6B:
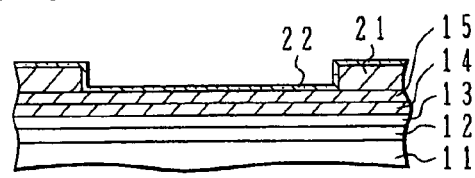
Figure 6C:
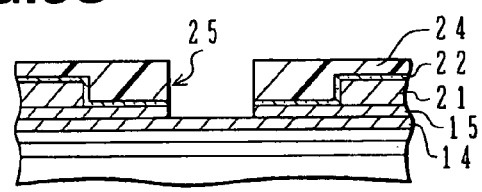
Figure 6D:
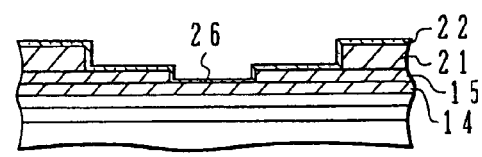
Figure 6E:
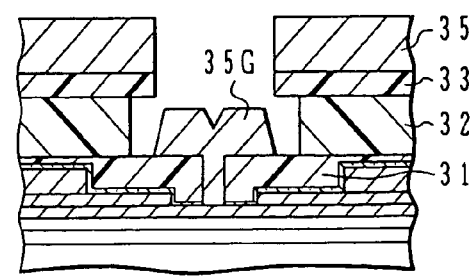
Figure 6F:
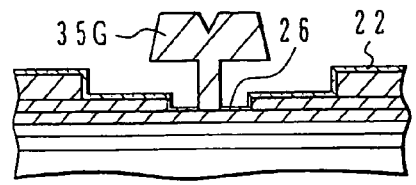
Figure 6G:
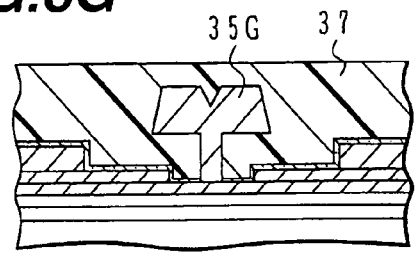
Figure 6H:
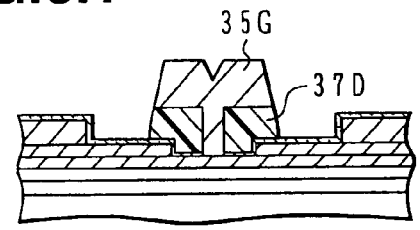
Figure 6I:
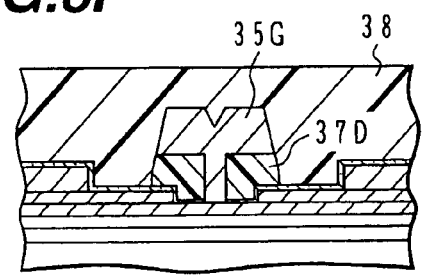
Figure 6J:
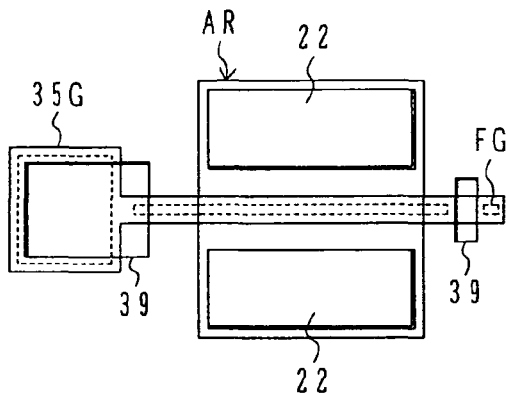
Figure 6M:
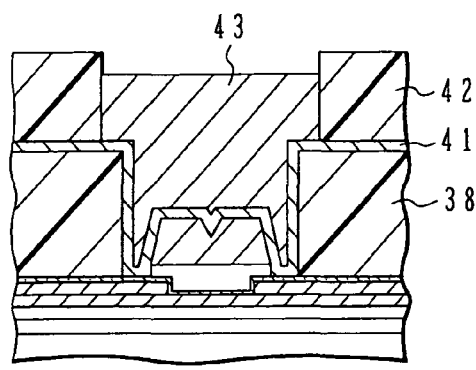
Figure 6K:
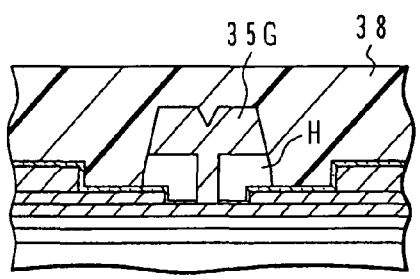
Figure 6N:
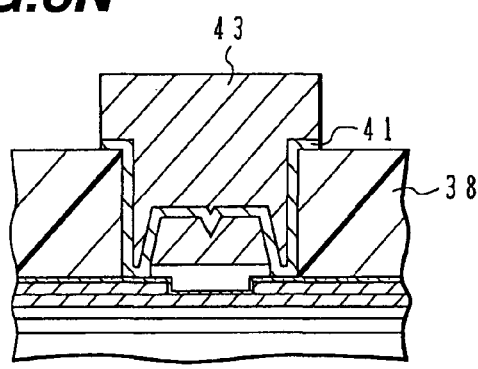
Figure 6L:
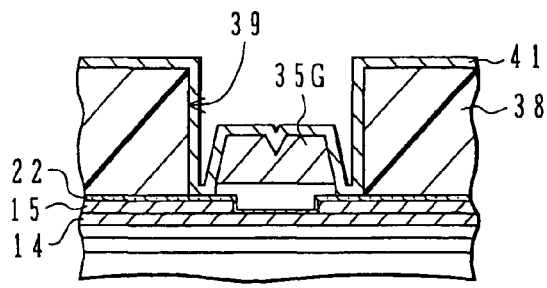
Figure 6O:
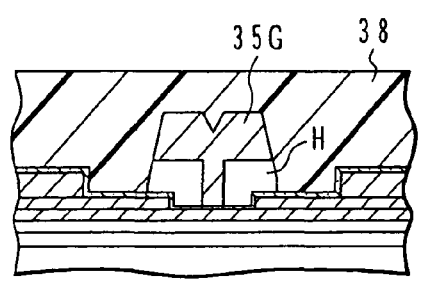

FIGS. 6A to 6O are cross sectional views and a plan view illustrating a method of manufacturing a semiconductor device according to a more specific embodiment of the invention.

As shown in FIG. 6A, on a semi-insulating GaAs underlying substrate 11, a lamination structure is grown, for example, by metal organic chemical vapor deposition (MOCVD). The lamination structure is constituted of epitaxial layers including, from the bottom, a GaAs buffer layer 12, an InGaAs electron transfer (or channel) layer 13, an n-type AlGaAs electron supply layer 14 and an n-type GaAs low resistance layer 15. The region excepting the active region is a semi-insulating region doped with oxygen.

As shown in FIG. 6B, a resist layer is exposed and patterned (developed). On the substrate with this resist layer, a lamination or stack structure is formed which is constituted of an AuGe layer having a thickness of about 20 nm for example and an Au layer having a thickness of about 200 nm for example. Ohmic electrodes 21 of the lamination structure are formed by lift-off. One of the ohmic electrodes 21 is a source electrode and the other is a drain electrode. An SiN layer 22 is deposited on the whole substrate surface. The SiN layer 22 functions as a protective film of the semiconductor surface.

As shown in FIG. 6C, a positive type electron beam resist (ZEP520-A7) layer 24 is spin coated on the substrate surface to a thickness of about 300 nm. Heat treatment is performed for 5 minutes at 180° C. The electron beam resist layer 24 is subjected to electron beam drawing (exposure) and developed to form an opening 25. The opening 25 defines a recess region, in which the fine gate of a gate electrode is formed to leave the regions having a width of about 0.1 µm on both sides of the fine gate.

By using the resist pattern 24 as a mask, the SiN protective layer 22 is selectively etched and removed by dry etching using $SF_6$ etchant. The GaAs low resistance layer 15 in the substrate surface layer is selectively etched and removed by dry etching using $SiCl_4$ etchant.

As shown in FIG. 6D, the resist pattern 24 is removed and an SiN film 26 is formed covering the surface of the newly exposed semiconductor layer.

As shown in FIG. 6E, a positive type electron beam resist (ZEP2000) layer 31 is spin coated to a thickness of about 300 nm. Heat treatment is performed for 5 minutes at 180° C. On the positive type electron beam resist layer 31, a reverse-taper forming polymethylglutarimide layer 32 and an over gate patterning positive type electron beam resist (ZEP520-A7) layer 33 are laminated to form a resist lamination structure.

The electron beam resist layer 33 is subjected to exposure for the over gate by electron beam drawing, and the electron beam resist layer 31 is subjected to exposure for the fine gate. Thereafter, development is performed to remove the exposed regions of the electron beam resist layers 31 and 33. The organic material layer 32 for the formation of the reverse taper is patterned to form a laterally broadened opening. Development may be performed after all the exposure processes are performed or alternatively a partial region may be exposed and developed and thereafter the remaining region is exposed and developed.

After such a resist lamination structure is formed, the SiN protective layer 26 is selectively removed through dry etching using $SF_6$ etchant. Thereafter, for example, a Ti layer having a thickness of about 10 nm, a Pt layer having a thickness of about 10 nm and an Au layer having a thickness of about 300 nm are laminated to form a gate electrode layer 35. The gate electrode deposited in the opening of the resist lamination structure forms a gate electrode 35G.

As shown in FIG. 6F, the resist lamination structure is removed to remove the gate electrode layer on the resist lamination structure by lift-off and leave the gate electrode 35G.

As shown in FIG. 6G, on the substrate, a filler layer 37 of polymethylglutarimide is spin coated to a thickness of about 600 nm. The filler layer 37 completely buries the gate electrode 35G. The filler layer 37 is subjected to heat treatment for 10 minutes at 250° C. It is sufficient if the filler layer 37 reaches at least under the over gate of the gate electrode 35G.

As shown in FIG. 6H, by using the mushroom gate electrode 35G as a mask, the filler layer 37 of polymethylglutarimide is dry etched by using oxygen. Filler layers 37D are left under the over gate of the gate electrode 35G.

As shown in FIG. 6I, an interlayer insulating film 38 of organic material benzocyclobutene is spin coated to a thickness of about 1 µm, covering the gate electrode 35G. The interlayer insulating film is gradually heated and subjected to heat treatment for 10 minutes at 250° C. This heat treatment fluidizes both the filler layer 37D and interlayer insulating film 38. The interface between the filler layer 37D and interlayer insulating film 38 becomes a curved surface because of the surface tension. Stress generated when the interlayer insulating film 38 was formed is released.

As shown in FIG. 6J, dissolution liquid inlet/outlet ports 39 are formed through the interlayer insulating layer 38 in the area outside of the active region AR and over the gate electrode 35G. Dissolution liquid for dissolving the filler layer is entered and drained via the dissolution liquid inlet/outlet ports 39. The dissolution liquid inlet/outlet ports 39 expose partial surface areas of the filler layer 37D under the over gate.

Although the fine gate is formed traversing the active region, it is not formed partially under the dissolution liquid inlet/outlet ports 39. If auxiliary exposure is performed for the region where the dissolution liquid inlet/outlet ports are formed, the lower surface of the over gate is lowered.

As shown in FIG. 6K, the substrate is immersed for 10 minutes in solution of N-methyl-2-pyrrolidinone heated up to 75° C. to remove the filler layer 37D under the gate electrode over the length of 50 µm and form a hollow space H.

As shown in FIG. 6L, a plating seed metal layer 41 of Ti is formed on the substrate surface by sputtering to a thickness of about 100 nm and an Au layer is formed on the plating seed metal layer by sputtering to a thickness of about 50 nm. In the inlet/outlet ports 39, the seed metal layer 41 seals the narrow gap formed between the over gate and substrate in the openings 39.

As shown in FIG. 6M, a resist pattern 42 is formed covering the unnecessary region, and an Au lead wiring pattern 43 is formed on the seed metal layer 41 by plating. The resist pattern 42 is thereafter removed and the exposed seed metal layer 41 is removed.

FIG. 6N shows the structure of the gate lead wiring pattern formed in the above manner. As shown, the fine gate is not formed in the area of the dissolution liquid inlet/outlet ports and the hollow space is formed therein.

FIG. 6O shows the structure of the gate electrode in the active region. The fine gate is formed in the active region. The side areas of the fine gate and the area under the over gate is the hollow space H.

In the above description, the filler layer is patterned and after the insulating resin layer is coated, the heat treatment is performed. Instead, after the filler layer is patterned, the remaining filler layer pattern may be fluidized. For example, in the state shown in FIG. 6H, heat treatment may be performed for 5 minutes at 200° C.

Figure 7:
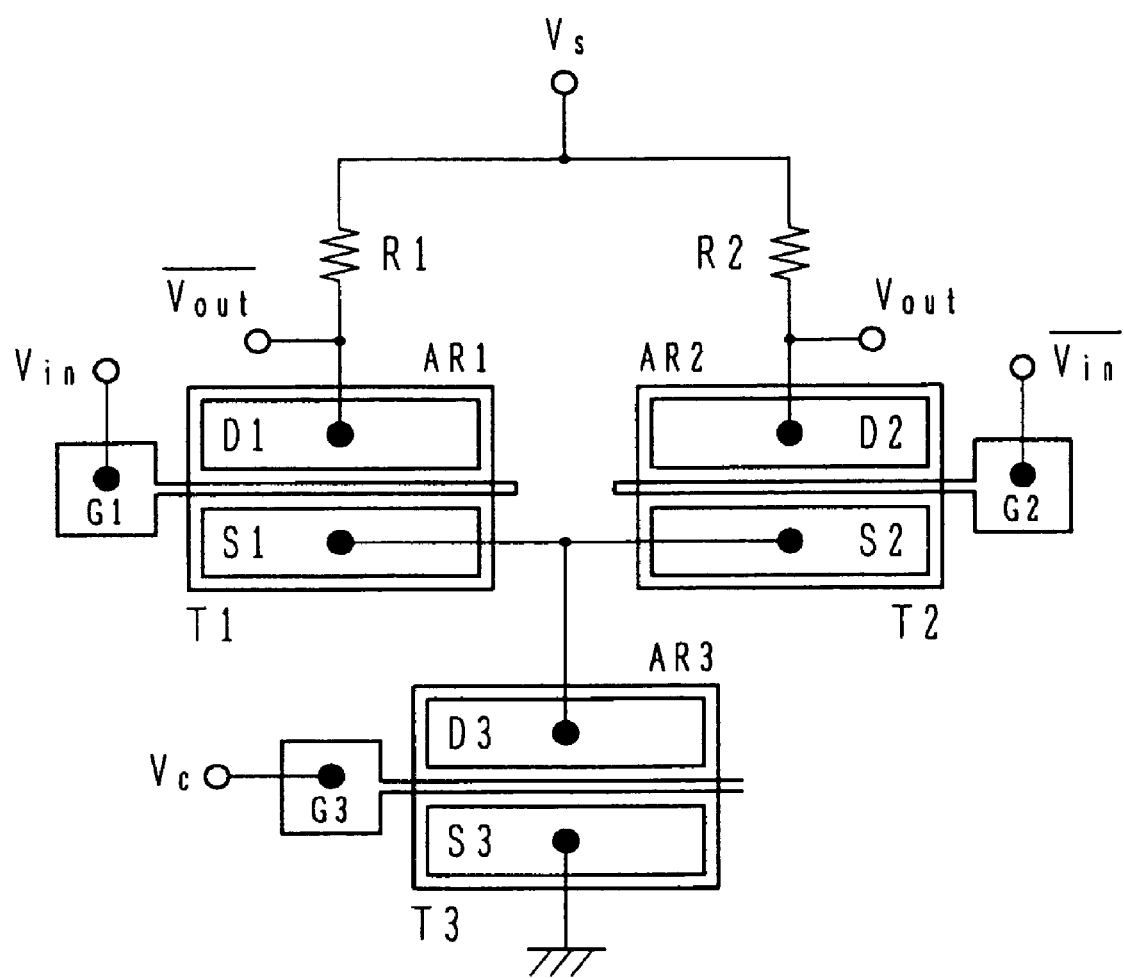
FIG. 7 is a schematic plan view showing the structure of a semiconductor integrated circuit device.
Figure 8:
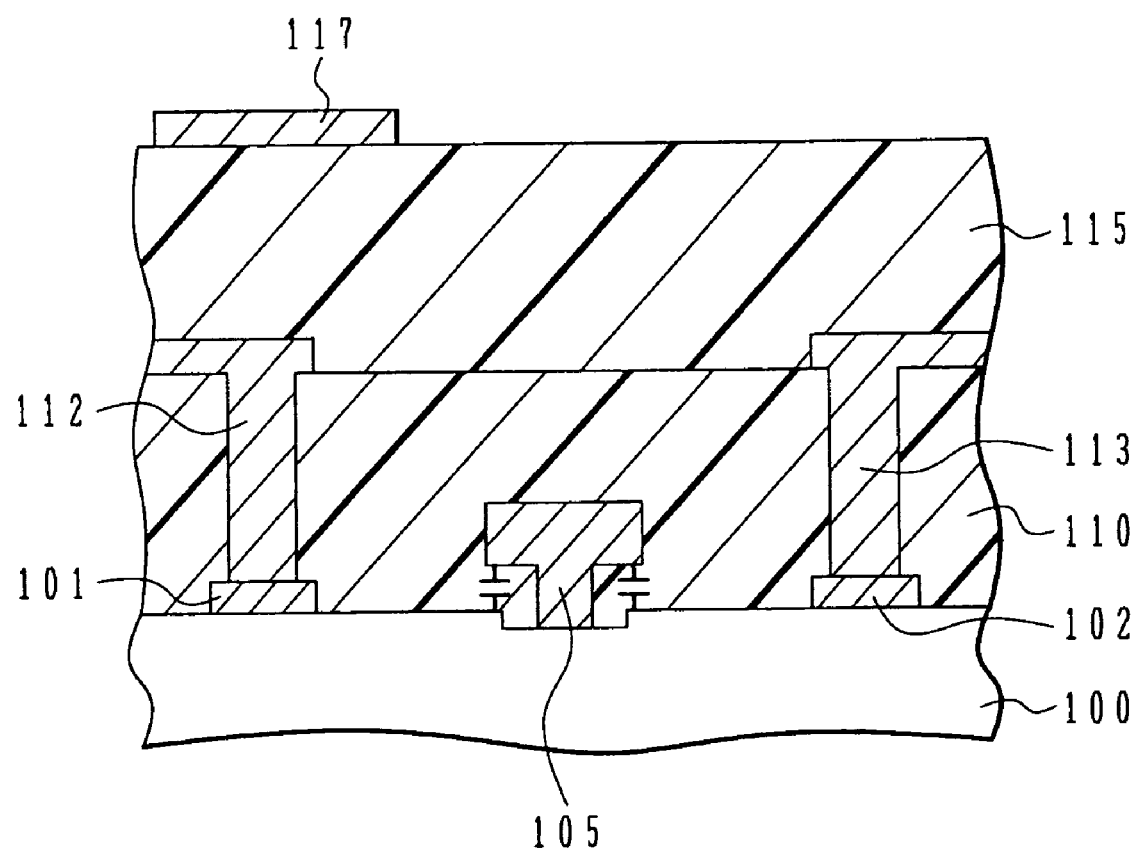
FIG. 8 is a schematic cross sectional view showing the structure of a semiconductor device according to related art.

FIG. 7 is a schematic diagram showing the structure of an integrated circuit device utilizing the transistor structure described above. A differential pair circuit is shown as an example of an integrated circuit device. Transistors T1, T2 and T3 are formed in active regions AR1, AR2 and AR3. The transistors T1 and T2 are switching or driving transistors and the transistor T3 is a constant current source transistor. Gate electrodes G1, G2 and G3 are formed traversing the respective active regions.

The gate electrode is at least partially surrounded by the hollow space as described earlier so that the parasitic capacitance is small. An improved operation speed of the switching transistors T1 and T2 greatly contributes to the improvement on the circuit operation speed.

An input signal Vin and its inverted signal /Vin (the symbol / means an inverted signal) are applied to the gate electrodes G1 and G2. A power supply voltage Vs is applied to drain electrodes D1 and D2 via load resistors R1 and R2. An inverted output signal /Vout and an output signal Vout are output from one ends of the load resistors R1 and R2 to a next stage circuit.

Source electrodes S1 and S2 are connected in common and connected to the drain electrode D3 of the constant current source transistor T3. A control gate voltage Vc is applied to the gate electrode G3 of the constant current source transistor T3 to maintain a constant current. It is obvious that various circuit elements can be integrated on the same semiconductor substrate. The circuit elements are interconnected by multi-level wiring layers.

The present invention has been described in connection with the preferred embodiments. The invention is not limited only to the above embodiments. For example, the order of exposure and development for the three-layer resist structure can be varied in various ways. It will be apparent to those skilled in the art that various modifications, improvements, combinations, and the like can be made.

What we claim are:

1. A method of manufacturing a semiconductor device comprising the steps of:
   (a) forming a mushroom gate on a semiconductor substrate, the mushroom gate traversing an active region of the semiconductor substrate and having a fine gate and an over gate formed on the fine gate and constituting an electrode portion having a broadened size along a current direction;
   (b) coating a first organic material film on the semiconductor substrate, the first organic material film covering at least the fine gate and a lower surface of the over gate of the mushroom gate;
   (c) patterning the first organic material film and leaving the first organic material film only near at the mushroom gate;
   (d) coating a second organic material film having chemical characteristics different from chemical characteristics of the first organic material film, the second organic material film covering the left first organic material film;
   (e) forming an opening through the second organic material film to expose the first organic material film; and
   (f) dissolving and removing the first organic material film via the openings to form a hollow space in the second organic material film.

2. A method of manufacturing a semiconductor device according to claim 1, wherein:
   the method further comprises a step of:
   (y) etching the semiconductor substrate to a predetermined depth to form a recess in an area outside of the active region and nearer to the active region than a region where the opening is formed; and
   said step (f) forms the hollow space rising from the recess toward the active region.

3. A method of manufacturing a semiconductor device according to claim 1, wherein the first organic material film is made of polymethylglutarimide.

4. A method of manufacturing a semiconductor device according to claim 1, wherein the second organic material film is made of benzocyclobutene.

5. A method of manufacturing a semiconductor device according to claim 1, wherein said step (f) includes wet etching using N-methyl-2-pyrrolidinone.

6. A method of manufacturing a semiconductor device according to claim 1, wherein:
   said step (b) forms the first organic material film covering the whole of the mushroom gate; and
   said step (c) comprises steps of:
   (c-1) forming a mask on the first organic material film above the mushroom gate in the active region; and
   (c-2) by using the mask, etching the first organic material film.

7. A method of manufacturing a semiconductor device according to claim 6, wherein said step (c-1) forms the mask covering an upper surface of the over gate on a source side and not covering the upper surface of the over gate on a drain side in the active region.

8. A method of manufacturing a semiconductor device according to claim 1, further comprising after said step (c) a step of:
   (x) fluidizing the first organic material film.

9. A method of manufacturing a semiconductor device according to claim 8, wherein said step (x) is executed after said step (d) to fluidize also the second organic material film.

10. A method of manufacturing a semiconductor device according to claim 8, wherein said step (a) comprises:
    (a-1) forming a resist lamination structure having a lower resist layer and an upper resist layer on the semiconductor substrate:
    (a-2) exposing an over gate pattern in the upper resist layer;
    (a-3) exposing a fine gate pattern in the lower resist layer;

(a-4) performing auxiliary exposure at an exposure amount smaller than an exposure amount of said step (a-3) to the lower resist layer, the auxiliary exposure traversing a span of the over gate pattern along the current direction in a partial area of the gate pattern;

(a-5) developing the resist lamination structure subjected to the exposure and auxiliary exposure to pattern the upper resist layer having an opening of the over gate pattern and the lower resist layer having an opening of the fine gate pattern and an over gate lowering region having an upper surface being lowered by the auxiliary exposure;

(a-6) depositing a gate electrode layer on the patterned resist lamination structure; and (a-7) lifting off the gate electrode layer on the resist lamination structure to leave the mushroom gate.

11. A method of manufacturing a semiconductor device according to claim 10, wherein:

said step (a) forms also a gate pad continuous with the mushroom gate in an area outside of the active region;

said step (e) forms an opening above the gate pad; and the method further comprises after said step (f) a step of:

(g) depositing a metal film above the second organic material film to seal the hollow space.

12. A method of manufacturing a semiconductor device according to claim 10, wherein said step (a-3) does not expose the fine gate pattern in a selected area outside of the active region and said step (e) forms the opening in an area near the selected area.

13. A semiconductor device comprising:

a semiconductor substrate having an active region;

a mushroom gate formed on said semiconductor substrate and traversing the active region, said mushroom gate having a fine gate and an over gate formed on the fine gate and having a broadened size along a current direction;

an organic material film defining a hollow space, the hollow space surrounding at least-side surfaces of the fine gate and a lower surface of the over gate respectively of said mushroom gate in the active region, the hollow space extending onto at least a portion of side surfaces and/or a top surface of said over gate, and the hollow space having a curved surface at an interface thereof; and an opening reaching the hollow space from an upper surface of said organic material film in an area outside of the active region.

14. A semiconductor device according to claim 13, wherein the hollow space covers the whole of said mushroom gate in the active region.

15. A semiconductor device according to claim 13, wherein the hollow space surrounds a source side region of said mushroom gate and touches lower and upper surfaces of the over gate, and an upper surface of the over gate of said mushroom gate on a drain side contacts said organic material film.

16. A semiconductor device according to claim 13, wherein the hollow space has a lower height at opposite end portions outside of the active region and the opening communicates with the hollow space at the lower height opposite end portions.

17. A semiconductor device according to claim 13, further comprising a metal layer formed on an inner surface of said opening, said metal layer sealing said hollow space.

18. A semiconductor device according to claim 13, wherein said mushroom gate has a region without the fine gate under the over gate in an area outside of the active region.

19. A semiconductor device according to claim 13, wherein said semiconductor substrate has a stepped recess which accommodates a base portion of the fine gate.

20. A semiconductor device according to claim 13, wherein said semiconductor substrate has a semi-insulating region surrounding the active region, the semi-insulating region being ion-implanted with oxygen to become semi-insulating.

21. A semiconductor device according to claim 13, wherein a lower surface of the over gate of said mushroom gate has a lowered height in a partial region outside of the active region, and the height of the hollow space under the over gate is lowered.

22. A semiconductor device according to claim 21, wherein said opening communicates with a region of the hollow space where the height of the lower surface of the over gate is lowered.

23. A semiconductor integrated circuit device comprising:

a semiconductor substrate having a plurality of active regions;

a plurality of mushroom gates formed on said semiconductor substrate, each of said mushroom gates traversing a corresponding one of said active regions, said mushroom gate having a fine gate and an over gate formed on the fine gate and having a broadened size along a current direction;

an organic material film defining a plurality of hollow spaces, the hollow space surrounding at least side surfaces of the fine gate and a lower surface of the over gate respectively of said mushroom gate in the active regions, the hollow space having a curved surface at an interface thereof; and a plurality of openings each reaching a corresponding one of the hollow spaces from an upper surface of said organic material film in an area outside of the active region, wherein some of the hollow spaces extend onto at least a portion of side surfaces and/or a top surface of the over gate.

24. A semiconductor device comprising:

a semiconductor substrate having an active region provided with a source and a drain;

a mushroom gate formed on said semiconductor substrate and traversing the active region between the source and the drain, said mushroom gate having a fine gate and an over gate formed on the fine gate and having a broadened size along a source-drain direction;

an organic material film defining a hollow space, the hollow space surrounding at least side surfaces of the fine gate and a lower surface of the over gate respectively of said mushroom gate in the active region, the hollow space having an asymmetric cross-sectional shape along the source-drain direction with respect to source side and drain side.

25. A semiconductor device according to claim 24, wherein said hollow space has a curved surface.

26. A semiconductor device according to claim 24, wherein said hollow space extends onto an upper surface of the over gate on the source side.

27. A semiconductor device according to claim 24, wherein said semiconductor substrate has a stepped recess which accommodates a base portion of the fine gate.

28. A semiconductor device according to claim 24, wherein said semiconductor substrate has a semi-insulating region surrounding the active region, the semi-insulating region being ion-implanted with oxygen to become semi-insulating.

29. A semiconductor device according to claim 28, wherein said semi-insulating region is doped with oxygen.

30. A semiconductor device comprising:
   a semiconductor substrate having an active region and a stepped recess traversing the active region;
   a mushroom gate formed on said stepped recess of the semiconductor substrate and traversing the active region, said mushroom gate having a fine gate and an over gate formed on the fine gate and having a broadened size along a current direction;
   an organic material film defining a hollow space, the hollow space surrounding at least side surfaces of the fine gate and a lower surface of the over gate, respectively, of said mushroom gate in the active region.

31. A semiconductor device according to claim 30, wherein said semiconductor substrate has a semi-insulating region surrounding the active region, the semi-insulating region being ion-implanted with oxygen to become semi-insulating.

32. A semiconductor device according to claim 31, wherein the hollow space occupies a region under the over gate of said mushroom gate and said organic material film covers an upper surface of the over gate.

\* \* \* \* \*